United States Patent [19]

Pollack et al.

[11] Patent Number: 4,956,307
[45] Date of Patent: Sep. 11, 1990

[54] THIN OXIDE SIDEWALL INSULATORS FOR SILICON-OVER-INSULATOR TRANSISTORS

[75] Inventors: Gordon P. Pollack; Mishel Matloubian, both of Dallas; Ravishankar Sundaresan, Garland, all of Tex.

[73] Assignee: Texas Instruments, Incorporated, Dallas, Tex.

[21] Appl. No.: 269,803

[22] Filed: Nov. 10, 1988

[51] Int. Cl.$^5$ .......................................... H01L 21/265
[52] U.S. Cl. ........................................ 437/40; 437/62; 437/938; 357/23.7; 357/52
[58] Field of Search ................... 437/62, 40, 238, 244, 437/968, 978, 938; 148/DIG. 86, DIG. 150

[56] References Cited

U.S. PATENT DOCUMENTS 4,703,554  11/1987  Havemann ............................. 437/31
4,714,685  12/1987  Schubert ............................... 437/41

FOREIGN PATENT DOCUMENTS 183563  8/1987  Japan.

OTHER PUBLICATIONS

Wolf, S. et al., Silicon Processing for the VLSI Era, Lattice Press, Sunset Beach, Calif., 1986, pp. 179-82.

Primary Examiner—Brian E. Hearn
Assistant Examiner—Laura Holtzman
Attorney, Agent, or Firm—James T. Comfort; Melvin Sharp; Douglas A. Sorensen

[57] ABSTRACT

A silicon-over-insulator transistor is provided having a semiconductor mesa (40) overlying a buried oxide (42). Insulating regions (50) are formed at the sides of the semiconductor mesa (40). An oxidizable layer (56) is formed over the mesa's insulating region (46). This oxidizable layer (56) is then anisotropically etched, resulting in oxidizable sidewalls (60). An optional foot (70) may be formed at the bottom edge of the oxidizable sidewalls (76). These oxidizable sidewalls (76) are then oxidized, resulting in a pure oxide sidewall (64). The gate (66) is then formed over the pure oxide sidewalls (64) and a gate oxide (62).

16 Claims, 2 Drawing Sheets

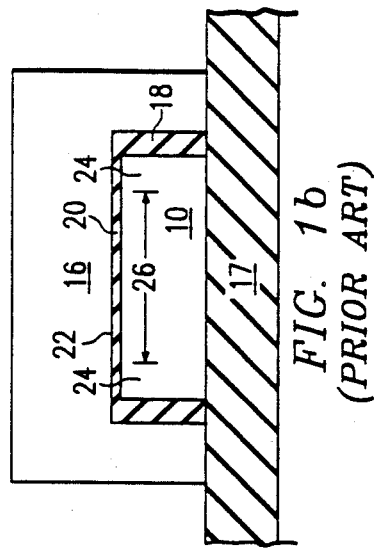
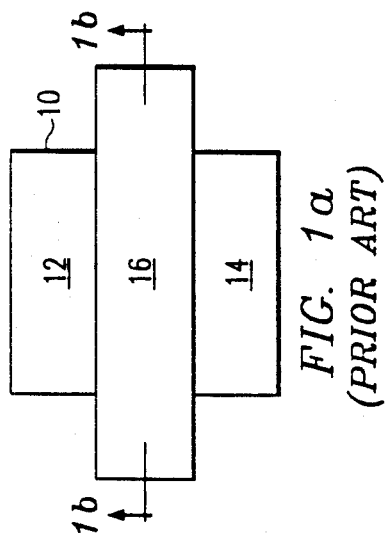
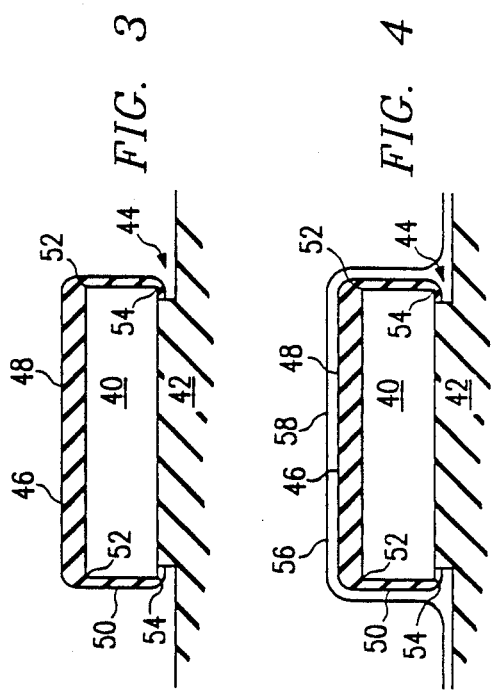
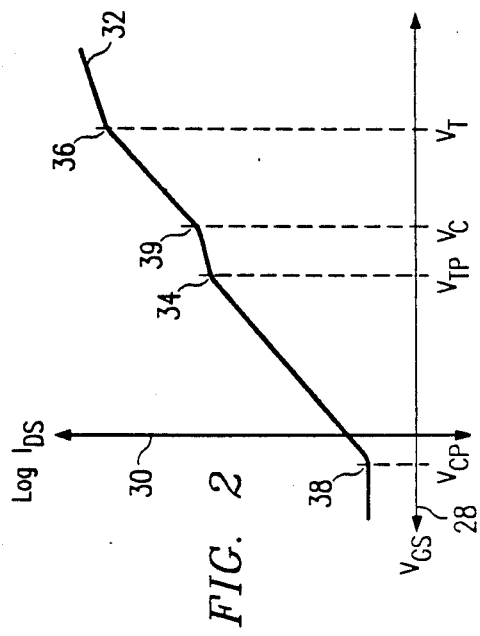

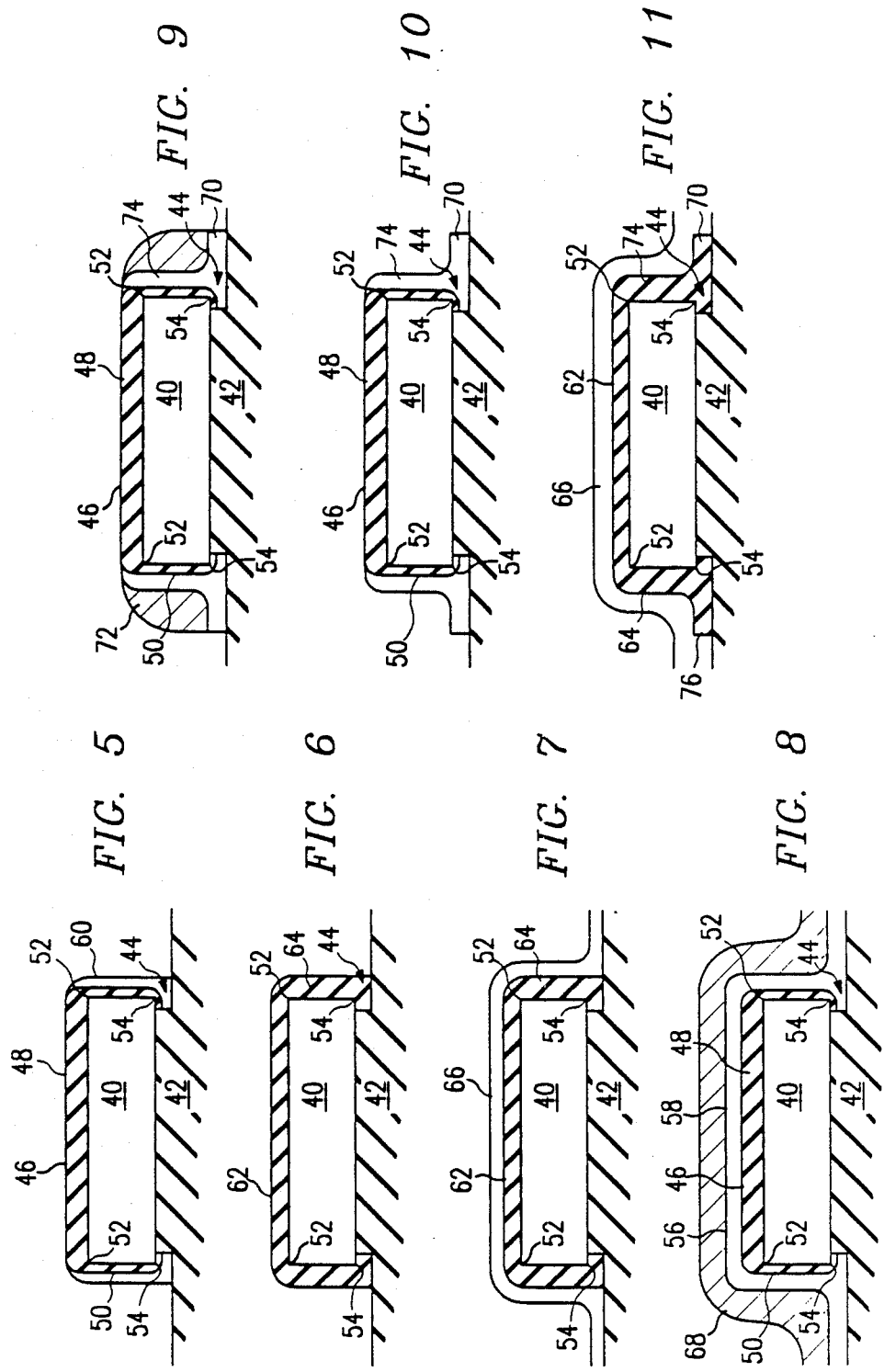

THIN OXIDE SIDEWALL INSULATORS FOR SILICON-OVER-INSULATOR TRANSISTORS

TECHNICAL FIELD OF THE INVENTION

This invention pertains in general to semiconductor devices, and more particularly to silicon-over-insulator transistors.

BACKGROUND OF THE INVENTION

It is often desirable, and in some instances even critical, for transistors to withstand exposure to radiation. Numerous military applications require transistors "hard" to a specified minimum dose of radiation. Failure of the transistor under radiation exposure can often have devastating consequences.

For mesa-isolated SOI (silicon-on-insulation) transistors, the effects of a parasitic transistor which forms along the mesa sidewalls can render the device inoperable after gamma radiation exposure. Advanced transistor design has proposed the use of a boron channel-stop implant to control this parasitic sidewall transistor during pre-radiation. However, under total dose radiation, positive charges (holes) trapped along the sidewall insulator can activate the parasitic sidewall transistor, thereby increasing current leakage or short-circuiting the transistor, leaving associated circuitry inoperable.

Various other techniques have been employed to increase transistor resistance to radiation. The goal of these methods has often been to minimize hole trapping within the insulating region between the transistor gate and semiconductor mesa. In one such structure, a pure oxide sidewall has been shown to yield a device hard to 1MRad of total radiation dose. However, the lack of uniformity in such oxide sidewall thickness causes potential points of voltage breakdown between the gate and the underlying semiconductor mesa. Another structure has been proposed which utilizes an oxide/nitride sidewall in an effort to maximize resistance to radiation exposure. The oxide/nitride stack appears to be effective in curing breakdown problems associated with the pure oxide sidewall. However, the operating characteristics of this stack under radiation exposure are complex and are not well understood. Testing to date has shown this stack device to show limited radiation hardness.

Therefore, a need has arisen for a transistor which is predictably hard to high levels of radiation, while minimizing problems in current leakage and voltage breakdown and providing consistent satisfactory operating characteristics.

SUMMARY OF THE INVENTION

In accordance with the present invention, a radiation hard transistor structure is provided which substantially eliminates or prevents disadvantages and problems associated with prior transistors.

The transistor of the present invention comprises an oxidizable sidewall utilized in a siliconover-insulator structure. The sidewalls initially comprise an oxidizable conforming layer which eliminates undercutting and maximizes gate oxide integrity. During processing, the sidewalls are oxidized leaving a resultant pure oxide sidewall. This pure oxide sidewall results in favorable characteristics of the transistor when exposed to high dosages of radiation.

In accordance with another aspect of the present invention, a method of fabricating a radiation hard transistor includes forming a mesa of semiconductor material and an insulator encompassing the mesa. Oxidizable sidewalls are formed on the sides of the insulator. A foot may be formed at, and extending from, the bottom edge of the sidewalls. More particularly, the oxidizable sidewalls may comprise either amorphous silicon or polysilicon. Either type of silicon may be doped to eventually yield a doped oxide sidewall following subsequent oxidation processes.

The present invention provides several technical advantages over prior art devices. Since a conforming layer is utilized rather than a pure oxide, the problem of nonuniformity in the thickness of the oxide layer is eliminated. This reduces the possibility of voltage breakdown between the gate and the semiconductor mesa. Furthermore, the ultimate oxide sidewall has minimal hole trapping characteristics and therefore ameliorates the effects of sidewall parasitic transistors. Another aspect of the present invention includes the ability to incorporate doped oxide sidewalls. The doped sidewalls provide the technical advantage of additional radiation hardness. These radiation resistant characteristics of the present transistor are provided without adversely affecting other operating characteristics of the device.

BRIEF DESCRIPTION OF THE DRAWINGS

For a more complete understanding of the present invention and the advantages thereof, reference is now made to the following descriptions taken in conjunction with the accompanying drawings, in which:

FIGS. 1a-1b illustrate a plan and a cross-sectional longitudinal view of a prior art silicon-over-insulator (SOI) transistor;

FIG. 2 illustrates the current/voltage characteristics of prior transistors having a parasitic transistor;

FIG. 3 illustrates a cross-sectional longitudinal view of a first embodiment of the transistor of the present invention after a first processing stage;

FIG. 4 illustrates a cross-sectional longitudinal view of the first embodiment of the transistor of the present invention after including an oxidizable layer;

FIG. 5 illustrates a cross-sectional longitudinal view of the transistor shown in FIG. 4 after an etching stage;

FIG. 6 illustrates a cross-sectional longitudinal view of the transistor of FIG. 5 after an oxidization stage;

FIG. 7 illustrates a cross-sectional longitudinal view of the transistor of FIG. 6 after inclusion of a gate layer;

FIG. 8 illustrates a cross-sectional longitudinal view of a second embodiment of the transistor of the present invention;

FIG. 9 illustrates a cross-sectional longitudinal view of the second embodiment of the transistor of the present invention after an anisotropic etching stage;

FIG. 10 illustrates a cross-sectional longitudinal view of the second embodiment of the transistor of FIG. 9 after an HF washing stage; and FIG. 11 illustrates a cross-sectional longitudinal view of the second embodiment of the transistor shown in FIG. 10 after inclusion of a gate layer.

DETAILED DESCRIPTION OF THE INVENTION

FIG. 1a illustrates a simplified plan view of a prior art silicon-over-insulator (SOI) transistor. The semiconductor mesa 10 has doped regions at its opposing ends shown as a drain 12 and a source 14. Overlying the semiconductor mesa 10 is the gate 16.

FIG. 1b illustrates a cross-sectional longitudinal view of FIG. 1a taken along section lines 1b–1b. The gate 16 overlies the semiconductor mesa 10 which is separated from gate 16 by sidewall insulators 18 and an overlying insulator 20. The semiconductor mesa 10 is formed over a buried oxide 17. When the transistor is exposed to a radiation, electron/hole pairs are generated in the insulator regions 18 and 20. Electrons are collected at the gate 16 due to the positive bias applied thereto. Electron mobility in the insulator region is higher than that of the holes. Therefore, holes remain in the insulator while electrons move to the gate 16. Because gate insulator 22 has inherent trapping characteristics, such holes are trapped in the gate insulator 22 under this radiation environment. As a result of the hole trapping, a positive charge develops throughout the gate insulator 22. Because the sidewall insulators 18 are typically thicker than the overlying insulator 20, more positive charge is trapped along the sidewall insulator 18 than along the overlying insulator 20. This lowers the conducting voltage at the mesa side areas 24 relative to the mesa central area 26. During radiation, holes are also trapped in the buried oxide 17, which couples with the charge along the sidewall insulator 18 further lowering the conducting voltage of the parasitic transistor. For example, in an N channel transistor, a positive gate bias enables (i.e. turns on) the transistor. Due to the stored positive charge along the sidewalls of the semiconductor mesa 10, a voltage applied along the gate 16 will add thereto and thus bias the sides of the mesa 24 at a voltage less than the threshold voltage for the central area of the mesa 26. This causes current to flow along the sides of the mesa 24 at a voltage lower than that required to enable the mesa central area 26, thereby causing the transistor to conduct at an undesired voltage level.

FIG. 2 illustrates the current/voltage characteristics of a prior art transistor having an undesired parasitic transistor along its sidewalls. The horizontal axis 28 represents the biasing voltage applied across the gate-to-source. The vertical axis 30 represents the amount of transistor current flow resulting from the applied gate-to-source voltage. The response curve 32 reflects two threshold voltages, $V_{TP}$ 34 and $V_T$ 36. Threshold voltage $V_{TP}$ 34 represents the level at which the sides of the mesa $V_T$ 24 will fully conduct. Similarly, threshold voltage 36 represents the level at which the mesa central area 26 will fully conduct. For a "soft" transistor (one having a high susceptibility to radiation exposure), the parasitic threshold voltage is much lower than that of the central area of the transistor. FIG. 2 demonstrates this effect. At a low biasing voltage, current begins to flow along the mesa side areas 24. This voltage is depicted as $V_{CP}$ 38, the conducting voltage of the parasitic transistor. Biasing the transistor above this voltage will cause current flow to increase according to the graph and eventually fully conduct at threshold voltage $V_{TP}$ 34. A second conducting voltage $V_C$ 39 is the bias necessary to cause the mesa central area 26 to begin to conduct.

Thus, in a soft transistor, exposure to radiation effectively lowers the conducting and threshold voltages and causes the transistor to conduct at a gate-bias much lower than that rated for the transistor. This characteristic can have adverse effects on any circuit in which the transistor is implemented. Therefore, a need has arisen for a radiation hard transistor in which the parasitic threshold voltage $V_{TP}$ 34 is greater than the threshold voltage $V_{TP}$ 36 of the mesa central area 26. The present invention provides such a transistor, which ensures proper operation of the transistor even under periods of exposure to high radiation.

The preferred embodiments of the present invention are illustrated in FIGS. 3–10 of the drawings, like numerals being used to refer to like and corresponding parts of the various drawings.

FIG. 3 illustrates a cross-sectional longitudinal view of a first embodiment of the present invention after a first processing stage. As a result of prior processing, a semiconductor mesa 40 is formed over a buried oxide 42. In order to construct the semiconductor mesa 40, a group of layers was conventionally formed. The layers included, in order, the buried oxide 42, a body of P type semiconductor material, an insulator (e.g. oxide) and a nitride. Typical thickness of the layers may include 4000 angstroms of buried oxide, 3,000 angstroms of semiconductor material, 350 angstroms of oxide and 1400 angstroms of nitride. A photoresist was then disposed over the group of layers and a controlled etch performed such that there remains the illustrated mesa 40 above the buried oxide 42, along with an overlying insulator 48 and a pad nitride (not shown). The pad nitride is then removed leaving the semiconductor mesa 40 with the overlying insulator 48, as shown in FIG. 3.

In accordance with the next aspect of the process, sidewall insulators 50 may then be either grown or deposited on the semiconductor mesa 40. Due to the various processing stages preceding the formation of the semiconductor mesa 40, an area of undercutting 44 has developed thereunder. The sidewall insulators 50 are typically on the order of 100 angstroms, and therefore significantly thicker than the ultimate gate oxide 62 (see FIG. 5). The semiconductor mesa 40 has upper corners 52 and lower corners 54. The thickness of the insulating region 46 around these corners 52 and 54 is narrower than the thickness of remainder of the oxide surrounding semiconductor mesa 40. As a result, a potential area for an early oxide breakdown exists at corners 52 and 54 between the semiconductor mesa 40 and the gate (not shown). The measure of this breakdown is known in the art as gate oxide integrity (GOI), which corresponds to the possibility of a voltage short circuit through the gate oxide between the gate (as shown in FIG. 7) and the semiconductor mesa 40.

FIG. 4 illustrates a cross-sectional longitudinal view of the first embodiment of the present invention after a second processing stage. A layer 56 of oxidizable substance having a portion 58 overlying mesa 40 is formed. Typically, this layer 56 may be 100–125 angstroms in thickness. The layer 56 of oxidizable substance is initially a non-oxide material, but has properties such that it can later be transformed into a pure oxide by subsequent processing. In a preferred embodiment, this oxidizable layer 56 comprises either amorphous silicon or polysilicon. Typically, a layer of either substance is formed by a low pressure chemical vapor deposition and, as a result, conforms to the exposed areas upon which it is placed. As a result, the area of undercutting 44 is filled by the oxidizable layer 56. Thus, when the gate layer is subsequently formed over the oxidizable layer 56, as will be subsequently described with respect to FIG. 7, the added thickness of layer 56 will reduce the likelihood of a short-circuit between the semiconductor mesa 40 and the gate. Consequently, the effects of undercutting are ameliorated and GOI is maximized. Furthermore, unlike a pure oxide, the oxidizable layer 56 will not be thinner at the mesa corners 52 and 54.

Therefore, the likelihood of voltage breakdown at these corners 52 and 54 is substantially reduced.

FIG. 5 illustrates a cross-sectional longitudinal view of the first embodiment of the present invention after a third processing stage. The device depicted in FIG. 4 is subjected to an anisotropic etch. The anisotropic etch is used to remove the overlying oxidizable layer 58 above the semiconductor mesa 40. As a result of the etching of the oxidizable layer 56, an oxidizable sidewall 60 remains at the sides of the semiconductor mesa 40. Thus, a transistor subassembly exists having oxidizable sidewalls 60.

FIG. 6 illustrates a cross-sectional longitudinal view of the transistor of FIG. 5 after a fourth processing stage. The insulating region 46 of FIG. 5 is deglazed, typically using an HF solution. During the HF wash, the area of undercutting 44 is protected from the HF solution by the oxidizable sidewall 60. Following the deglazing, a new gate oxide 62 is grown above the semiconductor mesa 40 at a thickness of approximately 200 angstroms. This process typically involves heating the structure in an oxidizing ambient. Because the preexisting sidewall 60 (see FIG. 5) is oxidizable, this process also oxidizes sidewall 60, thereby creating a pure oxide sidewall 64. The oxidation of the oxidizable sidewalls 60 creates a cumulated thickness of pure oxide sidewall 64 on the order of 300-350 angstoms. Thus, the benefit of having a pure oxide sidewall 64 in minimizing parasitic transistor effects has been accomplished, while preventing the undercutting problems typically associated therewith.

If desired, a doped oxidizable layer 56 (see FIG. 4) may be used in forming the transistor. Subsequent oxidation of the doped layer will naturally result in a doped oxide. A doped oxide will trap electrons, in addition to holes, and therefore the two charges will counterbalance and negate one another. As a result, parasitic transistor effects will be minimized under radiation exposure because the sidewalls are effectively charge neutral.

FIG. 7 illustrates a cross-sectional longitudinal view of the first embodiment of the present invention after a fifth processing stage. Following oxidation of the sidewall 64, a gate region 66 is then formed over the gate oxide 62 and the oxidized sidewalls 64. Typically, the gate region 66 comprises a doped polysilicon layer of 4500 angstroms in thickness, which is etched to form the gates of the various transistors in the circuit. It may now be appreciated that the gate region 66 is further separated from the semiconductor corners 52, 54 by the additional thickness from the oxidizable sidewall 60.

FIG. 8 illustrates a cross-sectional longitudinal view of a second embodiment of the present invention. The structure shown in FIG. 8 depicts a processing stage which follows that depicted in FIG. 4. Rather than proceeding immediately to an anisotropic etch as shown in FIG. 5, FIG. 8 shows an additional processing step wherein a deposited oxide (TEOS) layer 68 is placed over the oxidizable layer 56. This allows for the subsequent formation of a foot 70 (as shown in FIG. 10) at the bottom edge of the sidewalls.

As shown in FIG. 9, the structure depicted in FIG. 8 is subjected to an anisotropic etch which partially removes the TEOS layer 68 and the overlying oxidizable layer 58. As a result, a TEOS sidewall 72 and an oxidizable sidewall 74 are formed. Due to the overlying TEOS substance 68 prior to the etch, the foot 70 at the bottom edge of the oxidizable sidewall 74 is masked from the anisotropic etch. The length of the foot 70 will be determined by the thickness of the TEOS layer 68. This is because the oxidizable layer 56 is shielded from the anisotropic etch to the extent of the thickness of the vertical portions of the TEOS layer 68.

FIG. 10 illustrates a cross-sectional longitudinal view of the second embodiment of the present invention after a subsequent processing stage. The TEOS sidewall 72 (FIG. 9) is completely removed, leaving a foot 70 at the bottom edge of the oxidizable sidewall 74. The existence of the foot 70 effectively shifts any subsequent undercutting to the outside edge 76 thereof and thus away from the semiconductor mesa 40. Thus, degradation of GOI is minimized.

FIG. 11 illustrates a cross-sectional longitudinal view of the second embodiment of FIG. 10 after additional processing steps. The insulating region 46 is removed and an HF solution is used for deglazing. In this second embodiment however, protection from undercutting is extended further away from the semiconductor mesa 40 to the outside edge 76 of the foot 70. Thereafter, the gate region 66 is formed over the gate oxide 62. Again, the process of growing the gate oxide 62 is effected in an oxidizing ambient, thereby causing the oxidizable sidewall 74 to oxidize and forming a pure oxide sidewall 64. The newly grown gate oxide 62 is typically 200 angstroms in depth. The gate region 66 is then defined as discussed in connection with FIG. 7.

The present invention provides several advantages over the prior technology. An oxidizable layer having uniform thickness overlies the gate insulator, thereby improving gate oxide integrity by reducing the chance of breakdown and minimizing undercutting. Further, once oxidized, the sidewall provides optimal hole trapping characteristics to alleviate the effects of the sidewall parasitic transistor.

Although the present invention has been described in detail, it should be understood that various changes, substitutions and alterations can be made herein without departing from the spirit and scope of the invention as defined by the appended claims.

What is claimed is:

1. a method of forming a radiation hard transistor comprising:
    forming a mesa from semiconductor material;
    forming an insulated region adjacent to said mesa;
    forming a conforming oxidizable layer on the sides of said insulator region;
    anisotropically etching said oxidizable layer; and
    oxidizing said oxidizable layer to create oxide sidewalls.

2. The method of claim 1 wherein said step of forming an insulator region comprises the step of forming an oxide encompassing said mesa.

3. the method of claim 1 wherein said step of forming an oxidizable layer comprises forming an amorphous silicon layer.

4. the method of claim 3 wherein said step of forming an amorphous silicon layer comprises the step of forming a doped amorphous silicon layer.

5. the method of claim 1 wherein said step of forming an oxidizable layer comprises forming a polysilicon layer.

6. The method of claim 5 wherein said step of forming a polysilicon layer comprises the step of forming a doped polysilicon layer.

7. the method of claim 1 wherein said step of forming said oxide sidewalls further comprises forming a foot at the bottom edge of said sidewalls.

8. the method of claim 7 wherein said step of forming said foot and said step of anisotropically etching said oxidable layer comprises:
  forming TEOS layer over said oxidizable layer;
  anisotropically etching said TEOS layer and said oxidable layer; and
  removing said TEOS layer in order to define said foot at the bottom edge of said sidewall.

9. a method of forming a transistor comprising:
  forming a mesa from semiconductor material;
  forming an insulator region encompassing said mesa;
  forming a conforming oxidable layer on said insulated region;
  forming a conforming spacer layer on said oxidable layer;
  anisotropically etching said spacer layer and said oxidable layer;
  removing said spacer layer; and
  oxidizing said oxidizable layer to create oxide walls.

10. The method of claim 9 wherein said step of forming an oxidable layer comprises forming an amorphous silicon layer.

11. the method of claim 10 wherein said step of forming an amorphous silicon layer comprises forming doped amorphous silicon layer.

12. The method of claim 9 wherein said step of forming an oxidable layer comprises forming a polysilicon layer.

13. The method of claim 12 wherein said step of forming a polysilicon layer comprises forming a doped polysilicon layer.

14. The method of claim 9 and further comprising forming a gate over said insulator region.

15. The method of claim 9 wherein said spacer layer comprises silicon dioxide.

16. The method of claim 15 wherein said spacer layer comprises TEOS silicon dioxide.

* * * * *